United States Patent [19]
Koinuma et al.

[11] Patent Number: 5,198,724
[45] Date of Patent: Mar. 30, 1993

[54] PLASMA PROCESSING METHOD AND PLASMA GENERATING DEVICE

[75] Inventors: Hideomi Koinuma; Shunpei Yamazaki, both of Tokyo; Shigenori Hayashi, Kanagawa; Akiharu Miyanaga, Kanagawa; Tadashi Shiraishi, Kanagawa, all of Japan

[73] Assignee: Semiconductor Energy Laboratory Co., Ltd., Kanagawa, Japan

[21] Appl. No.: 777,708

[22] Filed: Oct. 21, 1991

[30] Foreign Application Priority Data

Oct. 23, 1990 [JP] Japan .................... 2-286883

[51] Int. Cl.$^5$ ............................. H05H 1/24
[52] U.S. Cl. ................. 315/111.21; 313/231.31; 250/426
[58] Field of Search ............ 315/111.21, 111.41, 315/111.81, 111.71; 313/231.31, 231.41; 250/426

[56] References Cited

U.S. PATENT DOCUMENTS

| | | | |
|---|---|---|---|
| 3,579,027 | 5/1971 | Pater | 315/111.41 |
| 4,596,030 | 6/1986 | Herziger et al. | 315/111.71 X |
| 4,602,376 | 7/1986 | Doucet et al. | 315/111.71 X |
| 4,912,731 | 3/1990 | Nardi | 315/111.21 X |
| 4,987,345 | 1/1991 | Stormberg et al. | 315/111.21 |

*Primary Examiner*—Eugene R. LaRoche
*Assistant Examiner*—Do Hyum Yoo
*Attorney, Agent, or Firm*—Sixbey, Friedman, Leedom & Ferguson

[57] ABSTRACT

A plasma generating device includes a central conductor, a peripheral cylindrical conductor surrounding the central conductor, an insulating cylinder interposed between the central conductor and the peripheral conductor in order to prevent direct arc discharge from occurring between the central conductor and the peripheral conductor. The central and peripheral conductors and the insulating cylinder are coaxially arranged in order to define a cylindrical discharging space therein. By applying a high frequency energy to the central conductor, glow discharge is caused between the central and peripheral conductors. A reactive gas is introduced from one end of the discharging space, excited by the glow discharge and goes out from the other end as an excited plasma to a working place where a work piece is processed by the plasma.

21 Claims, 4 Drawing Sheets

PLASMA PROCESSING METHOD AND PLASMA GENERATING DEVICE

BACKGROUND OF THE INVENTION

1. Field of the Invention

The present invention relates in general to a plasma generating device and a plasma processing method.

2. Description of the Prior Art

Self-sustaining electric discharge takes place through a gas at air pressure when a high electric field is applied thereto, e.g. in the form of DC, AC or impulses. This kind of discharge can be sorted into corona discharge, glow discharge and arc discharge. If an electric field is applied uniformly through the gas, dielectric breakdown takes place uniformly to cause glow or arc discharge. If the electric field is partially strong, dielectric breakdown locally takes place to cause corona discharge. The corona discharge can be changed into uniform dielectric breakdown, i.e. arc discharge. The transition from corona discharge to arc discharge usually takes place directly rather than via glow discharge. This is because a very large number of ions collide with an electrode at a high pressure (atmospheric pressure), as compared with the case at a low pressure, and quickly elevate the temperature of the electrode to cause thermoelectronic emission, which characterizes arc discharge. It is known that glow discharge can be utilized when current is limited below 2A. Glow discharge, however, can not be easily controlled so that arc discharge is mainly utilized in actual applications such as welding, cutting.

Arc discharge is utilized to melt a work piece by virtue of high temperatures of the electrode and its positive column (gas temperature). The temperature of the work piece therefore necessarily rises to a very high temperature, e.g. 2000 to 6000 K.

An attempt has been carried out to stabilize glow discharge at air pressure to make it possible to carry out machining at room temperature (S. Kanazawa et al. J. Phys. D: Applied Physics 21(1988), pp. 838–840). In order to cause stabilized glow discharge at air pressure, the following conditions must be satisfied. 1. The discharging space is filled with He. 2. An insulator is interposed between electrodes (across the discharge path). 3. At least one of the electrodes is provided with its end in the form of a needle or a brush. 4. The frequency of the applied electric field is no lower than 3 KHz. The second condition is necessary for avoiding transition into arc discharge. The fourth condition is necessary for enabling current passing through the insulator. The third condition is necessary for making it easy to initiate discharge by forming a non-uniform electric field. Attempt has been made to give etching treatment to surfaces of organic substances such as polyimide or inorganic substances such as silicon.

These known methods, however, must be carried out by evacuating the reaction space in advance followed by introducing a reactive gas such as He. The existing methods treat the entirety of a substrate and can not selectively process small areas of the substrate.

BRIEF SUMMARY OF THE INVENTION

It is an object of the present invention to provide a plasma generating device capable of producing a plasma at the atmospheric pressure.

It is another object of the present invention to provide a plasma processing method capable of processing a work piece at a low temperature.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a plasma generating device comprises a central conductor (electrode), a peripheral conductor (electrode) surrounding the central conductor (electrode), an insulating cylinder interposed between the central conductor (electrode) and the peripheral conductor (electrode) in order to prevent direct arc discharge from occurring between the central conductor (electrode) and the peripheral conductor (electrode), a supporting structure for supporting the central conductor (electrode), the peripheral conductor (electrode) and the insulating cylinder in order to define a discharging space between the central conductor (electrode) and the insulating cylinder, an alternating current source operatively connected with the central conductor (electrode) and the peripheral conductor (electrode) in order to induce an alternating electric field therebetween, and a gas supply system for supplying a reactive gas into the discharging space. The reactive gas is composed mainly of He (70% or higher). By this structure, glow or corona discharge is caused in the discharging space to produce a plasma and the plasma can be produced in atmosphere of the air to which the reactive gas is added. The plasma thus produced is let out through an outlet port opened in the discharging space. By the use of the plasma thus let out, plasma processing of a work piece can be carried out. If etching is desired, an etchant such as a halogen or a halogen compound is included in the reactive gas.

FIGS. 1(A) and 1(B) are schematic explanatory plan and cross sectional views showing a general configuration of a plasma generating device in accordance with the present invention. The device comprises a central conductor (electrode) 11 and a peripheral cylindrical conductor (electrode) 12 enclosing the central conductor (electrode) 11 with an insulating cylinder 13 therebetween. One end of the cylindrical conductor (electrode) 12 is closed to define a discharging space closed at one end and opened at the other end. The discharging space is supplied with a gas consisting mainly of helium from a gas cylinder 17 through a flow rate controller 16 in order to cause a continuous gas flow. The central conductor 11 is made of a metal which is resistant to a corrosive plasma atmosphere. When a halogen such as fluorine or chlorine is introduced in helium to enhance etching effect, the central conductor is made of a metal having resistance to halogen etching action such as gold or platinum or the surface thereof is coated with such a metal.

The central conductor is supplied with an alternating current by means of an AC source 14 whereas the peripheral conductor 12 is grounded. The outer diameter OD of the central conductor 11 and the inner diameter ID of the peripheral conductor 12 are selected to satisfy the relationship of ID/OD≧3. This relationship is required to induce a non-uniform electric field in the discharging space (corona generation condition) for easily initiating discharge. The present invention, however, is not limited to this relationship because even if the ratio is less than 3 and even approaches near 1, glow discharge is possible without preceding corona discharge in certain conditions.

The insulating cylinder 13 is extending beyond the lower end of the conductors 12 and 11, provided for avoiding transition to arc discharge and made from an inorganic material such as a quartz glass, alumina or an organic material such as teflon, polyimide, polyethylene, polyethylene terephthalate. Particularly, quartz glass and alumina are desirable because of resistance to high temperatures. The initiation of discharge is easier when the cylinder 13 is made of a material having a higher dielectric constant to induce a higher electric field between the central conductor 11 and the insulating cylinder 13. Alumina and sodalime glass are desirable in this respect.

The thickness of the cylinder 13 is determined in accordance with the specific dielectric constant of the material of the cylinder 13. Namely, the thickness D in milimeter is no larger than the specific dielectric constant SD. The ratio of D/SD is desirably no larger than 0.2. The distance between the central conductor 11 and the insulating cylinder 13 is determined in order that the necessary voltage for the discharge does not exceed the available range of a practical AC source. Namely, the distance between the central conductor 11 and the insulating cylinder 13 is no larger than 5 mm, preferably no larger than 1 mm.

The lower limit of the frequency of the AC source is determined by the capacitive susceptance introduced by the cylinder 13. Namely, the capacitance between the central conductor (electrode) and the peripheral conductor (electrode) per unit length is calculated by the direct connection of the capacitance Ci of the cylinder and the gap capacitance Cg between the cylinder and the central conductor, which are represented by:

$$Cg = 2\pi\epsilon_0/\log(b/a), \quad Ci = 2\pi\epsilon/\log(c/b)$$

where "a" is the radius of the central conductor 11; "b" is the inner diameter of the insulating cylinder 13; "c" is the inner diameter of the peripheral conductor 12; "$\epsilon$" is the dielectric constant of the cylinder 13; and "$\epsilon_0$" is the dielectric constant of free space. The voltage applied between the central conductor and the peripheral conductor is divided at the ratio of Cg to Ci. In accordance with experiments, stabilized discharge was observed when the susceptance $\omega C$ was no lower than $10^{-6}$[S]. For example, in the case that a=0.5 mm, b=0.85 mm, c=1.25 mm, the length of the coaxial cylinders 13 mm, and the insulating cylinder is made of quartz whose specific dielectric constant is 3.8, the capacitance Ci is calculated as 13 pF so that the frequency is selected no lower than about 12 kHz.

The gas introduced into the discharging space has to include helium at no lower than 70%. Helium atoms are ionized or excited by the energy of discharge and come to have higher energy levels. The excitation of helium atoms is maintained in metastable states such as $2^3S_1$, $2^1S_0$. The lifetimes of the metastable states are as long as 0.1 msec to 1 sec, within which time excited helium atoms can travel through several millimeters when the speed of the atoms is 200 to 500 mm/sec. The energy levels of the metastable states are 19.8 and 20.96 eV so that other additive gas can be ionized and excited by the energy. Accordingly, it is possible to lead the excited helium atoms to a desired working place external to the discharging space and carry out a reaction utilizing the high energy of the excited helium atoms Additive gases to be used together with helium include inert gases such as Ne, Ar, Kr, Xe and halogen compounds such as $CF_4$, $CCl_4$, $NF_3$, which are used to carry out etching. In the case of Ar, discharge could not takes place if the proportion of Ar in the reactive gas is no lower than 70%. In the case of $CF_4$ discharge could not takes place if the proportion of $CF_4$ no. lower than 4% in the reactive gas. Hydrocarbons such as $CH_4$, $C_2H_4$ can be utilized as additives to deposit carbon films. Although silane such as $SiH_4$ can also be used to deposit silicon films, deposition in an open condition is sometimes dangerous.

Instead of the mixing of an additive gas with helium, a suitable reactive gas can be introduced directly to a working place by means of a nozzle or the like whereas excited helium radicals are conveyed in the gas flow to the working place. The reactive gas receives necessary energy from the helium radicals to carry out a desired reaction. During the reaction, no current flows through a work piece because no ion reaches to the working place but radicals. For this reason, a living body can be treated as the work piece if desired. For example, a tooth or a nail can be treated by the radicals or the reactive gas excited by the radicals.

The range within which the radicals can be conveyed alive can be changed by controlling the flow rate of the gas supply. In the case that the inner diameter of the insulating cylinder is 0.85 mm, the speed of the helium radicals is adjusted to be about 500 mm/sec by controlling the gas supply at 70 SCCM. The range of the radicals increases as the gas supply increases.

If a work piece is made of a conductive material, etching can be carried out by utilizing the work piece itself as one of a pair of electrodes between which discharge takes place. A sharp pin point can be formed by this method for example.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1A:
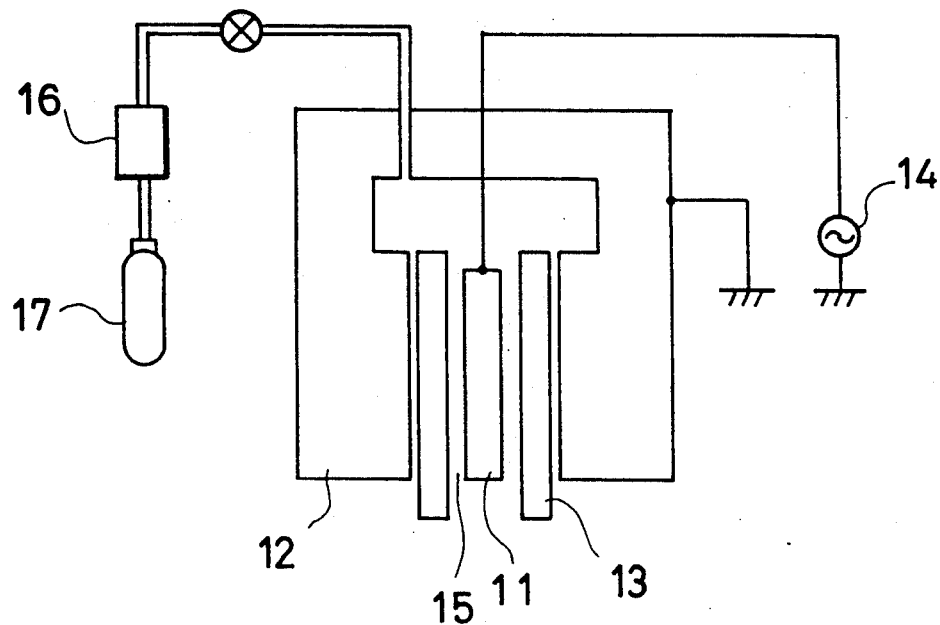
FIGS. 1(A) and 1(B) are schematic explanatory plan and cross sectional views showing a general configuration of a plasma generating device in accordance with the present invention.
Figure 1B:
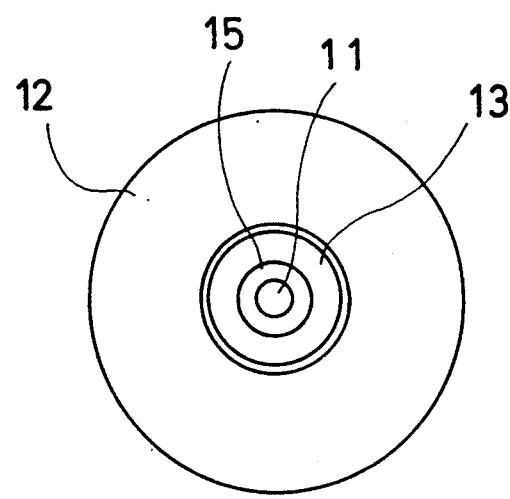
Figure 2:
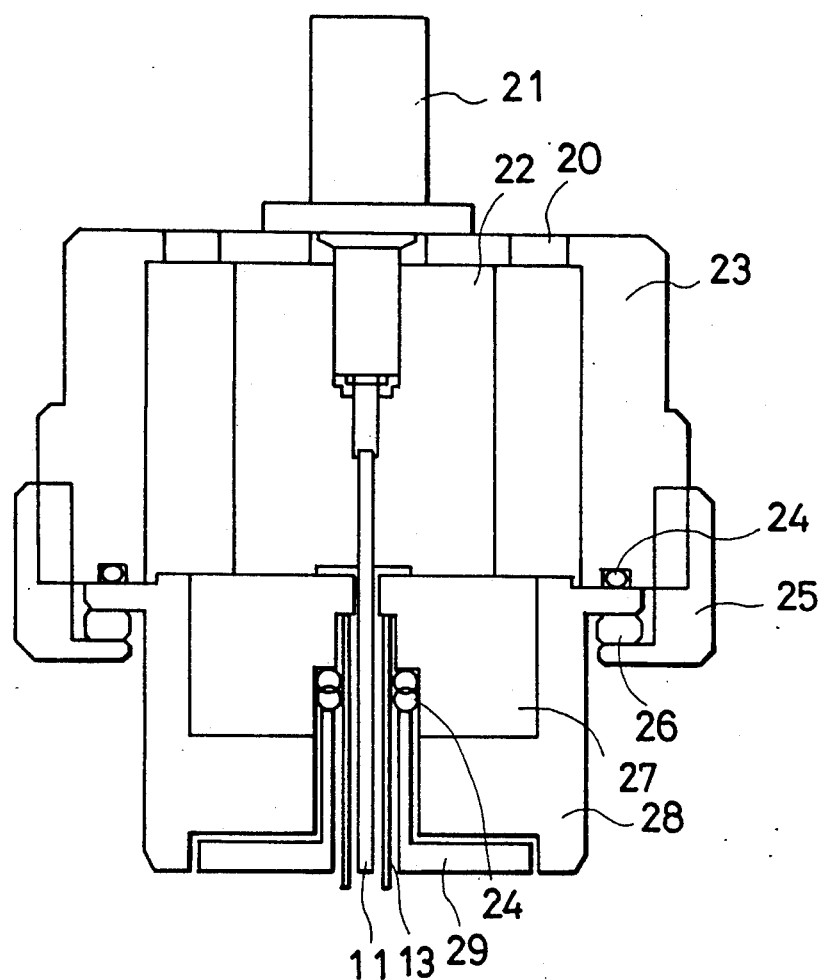
FIG. 2 is a cross sectional view showing a plasma generating device in accordance with the present invention.
Figure 3:
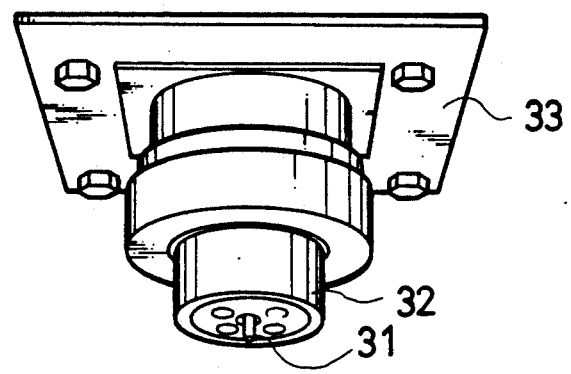
FIG. 3 is a perspective view showing a plasma generating device in accordance with the present invention.

Referring now to FIGS. 2 and 3, a plasma generating device in accordance with a first embodiment of the present invention will be explained. The device comprises a central conductor 11 in the form of rod and a peripheral cylindrical conductor 29 surrounding the central conductor 11 with an insulating cylinder 13 therebetween. The central conductor is made of wolfram and the insulating cylinder is made of quartz glass. The central conductor 11, the peripheral conductor 29 and the insulating cylinder 13 are coaxially arranged. The diameter of the central conductor 11 is 1 mm. The outer diameter of the insulating cylinder 13 is 2.5 mm. The thickness of the cylinder 13 is 0.4 mm. A cylindrical discharging space of 1.7 mm thickness is formed between the central conductor 11 and the insulating cylinder 13. The gap between the insulating cylinder 13 and the peripheral conductor 29 is filled with metal foil (not shown). The central conductor 11 is connected at its upper end with a MHV coaxial plug 21 which in turn is connected with a coaxial cable (not shown) in order to obtain high frequency electric energy from a suitable power source. Teflon insulators 22 and 27 are provided around the central conductor 11 in order to avoid undesirable discharge. The outer structure of the device includes an upper casing 23 and a lower casing 28 which are tightly joined by means of a clamping jig 25 and 26. The upper and lower casings 23 and 28, the clamping jig 25 and 26 and the peripheral conductor 29 are formed of stainless steel and grounded.

Figure 4:
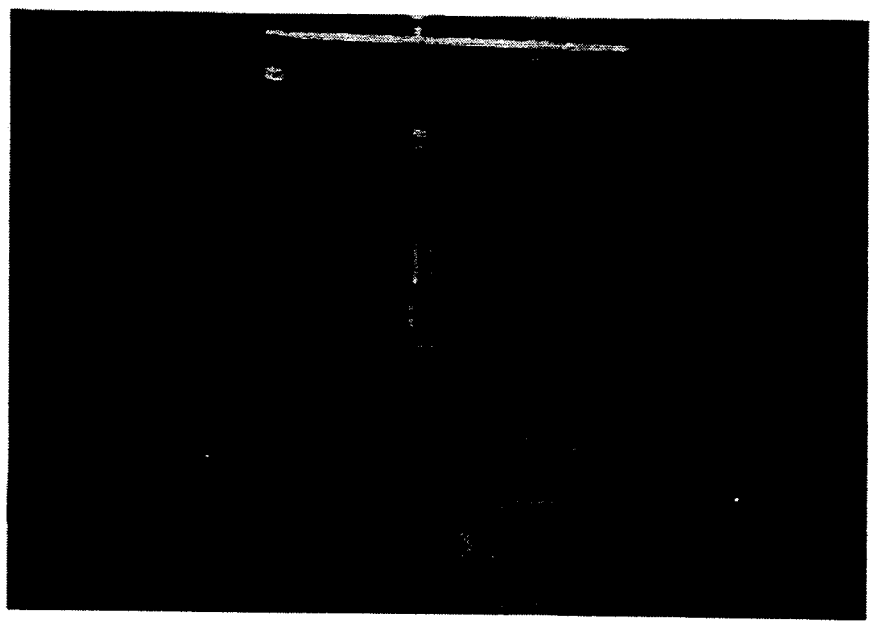
FIG. 4 is a copy of a photograph showing a plasma generating device causing glow discharge in accordance with the present invention.

The upper end of the upper casing 23 is provided with a gas inlet port 20. A gas composed mainly of helium is introduced from the gas inlet port 20 to the discharging space between the central conductor 11 and the insulating cylinder 13 through a passage formed along the Teflon insulators 22 and 27. Numerals 24 designate O-rings provided for sealing at contacts between the respective parts. The entirety of the device is fixed to a suitable structure supporting it by means of a base 33 as illustrated in FIG. 3. In the operation, helium is introduced from the inlet port 20 at 150 SCCM and high frequency electric energy of 13.56 MHz is supplied to the central conductor through the plug 21 at 70 W. In accordance with experiments, stable discharge was observed to produce a plasma as shown in a copy of a photograph of FIG. 4.

Next, effects of etching by the use of the device as illustrated above will be explained below. The etchant was $CF_4$ added to helium at 1 to 3%. The work pieces to be treated were silicon and alumina substrates whose surfaces were located 1 mm distant from the discharging space (from the lower end of the insulating cylinder 13). The frequency of the electric energy supplied to the central conductor was 13.56 MHz. The electric power thereof was 70 W. The flow rate of the He—$CF_4$ mixture was 70 SCCM. Table 1 shows etching effects of experiments where the proportion of $CF_4$ and the etching time were changed. Table 2 shows etching effects of experiments in which $CF_4$ was not used for reference where the etching time were changed and the distance between the substrates and the device was increased. In Table 2, "D" is the distance between the substrates and the device. The effects of etching were examined through the measurement of surface roughness. In the tables, circles indicate that etching effects were apparently confirmed; triangles indicate that etching effects were confirmed to some extent. X's indicate that etching effects were not confirmed.

TABLE 1

| NO. | $CF_4$ | etching time | substrate | effect |
|---|---|---|---|---|
| 1 | 1% | 60 sec | Si(100) | △ |
| 2 | 1% | 50 sec | Si(100) | △ |
| 3 | 1% | 40 sec | Si(100) | ◯ |
| 4 | 1% | 30 sec | Si(100) | ◯ |
| 5 | 1% | 20 sec | Si(100) | ◯ |
| 6 | 1% | 10 sec | Si(100) | ◯ |
| 7 | 2% | 60 sec | Si(100) | ◯ |
| 8 | 2% | 50 sec | Si(100) | ◯ |
| 9 | 2% | 40 sec | Si(100) | ◯ |
| 10 | 2% | 30 sec | Si(100) | ◯ |
| 11 | 2% | 20 sec | Si(100) | ◯ |
| 12 | 2% | 10 sec | Si(100) | △ |
| 13 | 1% | 20 min | $Al_2O_3$ | △ |
| 14 | 1% | 30 min | $Al_2O_3$ | △ |
| 15 | 1% | 60 min | $Al_2O_3$ | △ |

TABLE 2

| NO. | D | etching time | substrate | effect |
|---|---|---|---|---|
| 1 | 1 mm | 10 min | Si(100) | X |
| 2 | 1 mm | 20 min | Si(100) | X |
| 3 | 1 mm | 30 min | Si(100) | X |
| 4 | 1 mm | 60 min | Si(100) | X |
| 5 | 2 mm | 10 min | Si(100) | X |
| 6 | 2 mm | 20 min | Si(100) | X |
| 7 | 2 mm | 30 min | Si(100) | X |
| 8 | 2 mm | 60 min | Si(100) | X |

Figure 5:
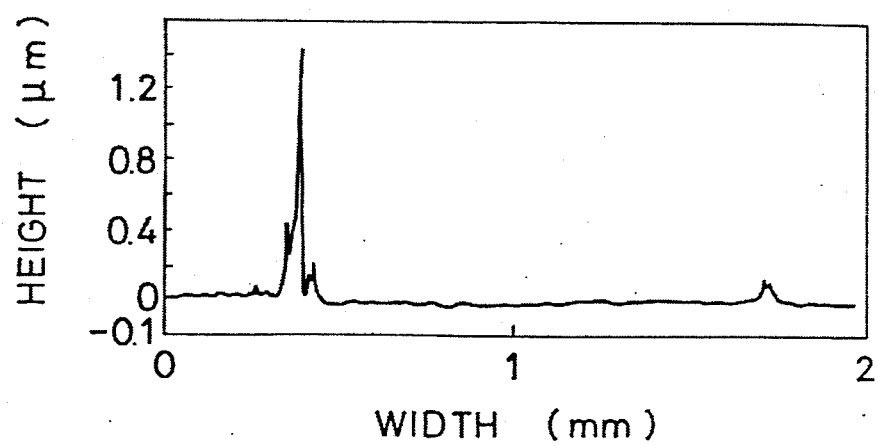
FIG. 5 is a graphical diagram showing the surface profile of the substrate which was treated by etching without the use of $CF_4$.
Figure 6:
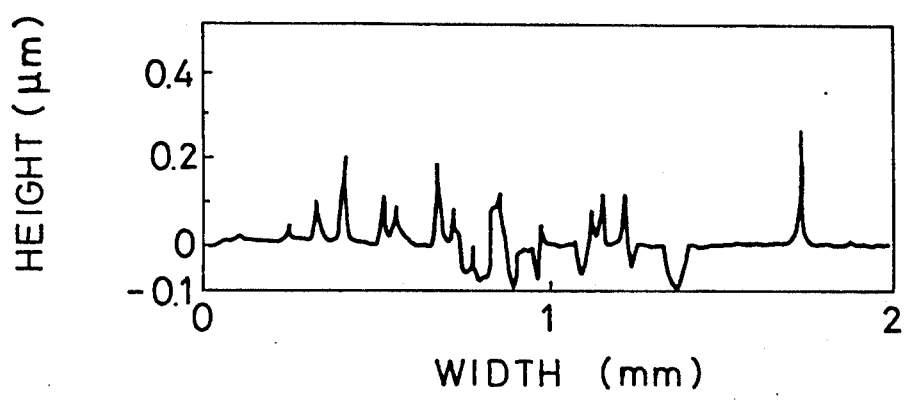
FIG. 6 is a graphical diagram showing the surface profile of the substrate which was treated by etching utilizing 1% $CF_4$.

As seen from the tables, even if the etching time was very short, etching was effective when the etchant gas $CF_4$ was used. FIG. 5 shows the surface profile of the silicon substrate which was treated by etching without the use of $CF_4$. The frequency of the AC energy was 13.56 MHz. The input power was 80 W. The gas flow rate was 70 SCCM. The reaction time was 60 minutes. FIG. 6 shows the surface profile of the silicon substrate which was treated by etching utilizing 1% $CF_4$ mixed with helium. The frequency of the AC energy was 13.56 MHz. The input power was 70 W. The gas flow rate was 70 SCCM. The reaction time was 30 seconds. In these graphical diagrams, the ordinate indicates the height of the surface. It was presumed by EPMA measurement that regions exceeding 0 $\mu m$ (original surface level) occurred because of tungsten deposition from the central conductor. From these diagrams, it is understood that etching was effective when the etchant gas was utilized (FIG. 6) and ineffective when the etchant gas was not utilized (FIG. 5).

Figure 7:
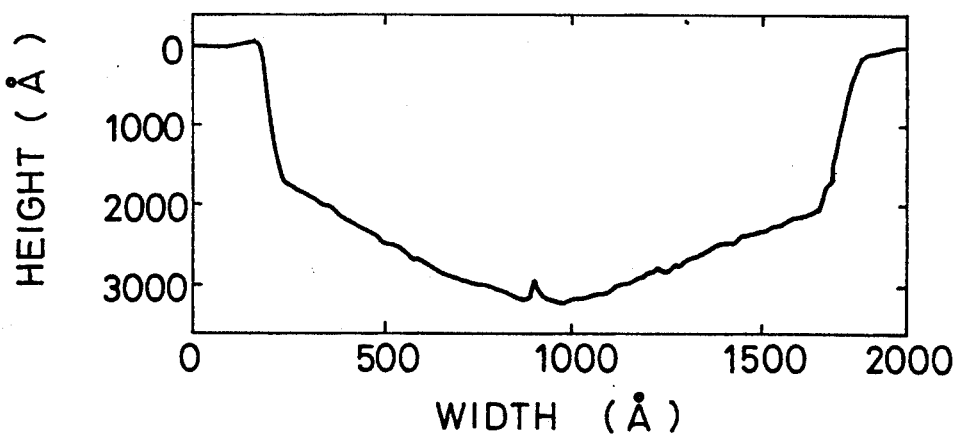
FIG. 7 is a graphical diagram showing the surface profile of the substrate which was treated by etching utilizing 1% $CF_4$.

FIG. 7 shows the surface profile of the silicon substrate which was treated by etching utilizing 1% $CF_4$ mixed with helium by the use of the same plasma generating device as described above except that the thickness of the cylinder 13 is 0.5 mm. The frequency of the AC energy was 13.56 MHz. The input power was 70 W. The gas flow rate was 70 SCCM. The reaction time was 1 min.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A plasma generating device comprising:
   a central electrode;
   a peripheral electrode surrounding said central electrode;
   an insulating cylinder interposed between said central electrode and said peripheral electrode and extending beyond lower ends of both said central electrode and said peripheral electrode in order to prevent direct arc discharge from occurring between said central electrode and said peripheral electrode;
   a supporting structure for supporting said central electrode, said peripheral electrode and said insulating cylinder in order to define a discharging space between said central electrode and said insulating cylinder;
   an alternating current source operatively connected with said central electrode and said peripheral electrode in order to induce an alternating electric field therebetween; and
   a gas supply system for supplying a reactive gas into said discharging space.

2. The plasma generating device as claimed in claim 1 wherein said central electrode, said peripheral electrode and said insulating cylinder are arranged in a coaxial relationship.

3. The plasma generating device as claimed in claim 2 wherein said central electrode is in the form of a rod.

4. The plasma generating device as claimed in claim 3 wherein said peripheral electrode is in the form of a cylinder.

5. The plasma generating device as claimed in claim 4 wherein said discharging space is a cylindrical space closed at one end and opened at the other end.

6. The plasma generating device as claimed in claim 5 wherein the gap between said central electrode and said insulating cylinder is no wider than 5 mm.

7. The plasma generating device as claimed in claim 5 wherein the thickness D in unit of mm and the specific dielectric constant SD of said insulating cylinder satisfies $D/SD \leq 1$.

8. The plasma generating device as claimed in claim 5 wherein said supporting structure and said gas supply system are adapted to form a continuous gas flow at atmospheric pressure through said discharging space from said one end to the other.

9. The plasma generating device as claimed in claim 1 wherein said insulating cylinder is made of Teflon.

10. The plasma generating device as claimed in claim 1 wherein said reactive gas comprises helium.

11. A method of plasma processing by the use of a plasma generating device comprising:
    providing a central electrode;
    providing a peripheral electrode surrounding said central electrode;
    providing an insulating cylinder interposed between said central electrode and said peripheral electrode and extending beyond lower ends of both said central electrode and said peripheray electrode in order to prevent direct arc discharge from occuring between said central electrode and said peripheral electrode;
    providing a supporting structure for supporting said central electrode, said peripheral electrode and said insulating cylinder in order to define a discharging space between said central electrode and said insulating cylinder, said discharging space being opened to air through an outlet port;
    providing an alternating current source operatively connected with said central electrode and said peripheral electrode in order to induce an alternating electric field therebetween;
    providing a gas supply system for supplying a reactive gas into said discharging space;
    introducing said reactive gas into said discharging space;
    causing discharge between said central electrode and said peripheral electrode by inducing said alternating electric field through said discharging space to produce a plasma;
    letting out said plasma through said outlet port; and
    carrying out plasma processing of a work piece by the use of said plasma.

12. The method of plasma processing as claimed in claim 11 wherein the discharge through said discharging space is glow discharge.

13. The method of plasma processing as claimed in claim 11 wherein the discharge through said discharging space is corona discharge.

14. The method of plasma processing as claimed in claim 11 wherein said reactive gas comprises helium.

15. The method of plasma processing as claimed in claim 14 wherein the proportion of helium in said reactive gas is no lower than 70%.

16. The method of plasma processing as claimed in claim 15 wherein said reactive gas includes Ne, Ar, Kr or Xe.

17. The method of plasma processing as claimed in claim 14 wherein helium atoms are excited into radicals.

18. The method of plasma processing as claimed in claim 11 wherein an etchant gas is included in said reactive gas in order to carry out etching process.

19. The method of plasma processing as claimed in claim 18 wherein said etchant gas is a halogen or a halogen compound.

20. The method of plasma processing as claimed in claim 19 wherein said etchant gas is $CF_4$, $CCl_4$ or $NF_3$.

21. The method of claim 11 wherein atmosphere in which said plasma is produced is atmosphere of the air to which said reactive gas is added by said introducing step.

* * * * *